United States Patent [19]

Singer et al.

[11] Patent Number: 5,481,073

[45] Date of Patent: Jan. 2, 1996

[54] MODULAR BROADBAND BIDIRECTIONAL PROGRAMMABLE SWITCH SYSTEM WITH STACKED MODULAR SWITCH ARRANGEMENT

[75] Inventors: Samuel Singer, Indiana; Francis J. DeSantis, Shelocta; Harry Krasnikoff, Indiana, all of Pa.

[73] Assignee: Quintech, Inc., Indiana, Pa.

[21] Appl. No.: 257,820

[22] Filed: Jun. 9, 1994

[51] Int. Cl.⁶ .............................. H01H 67/00; H01P 1/10; H05K 1/00; H04Q 11/00

[52] U.S. Cl. ................. 200/1 R; 200/175; 307/115; 333/101; 333/105; 340/825.02; 361/729; 361/784; 361/805

[58] Field of Search ...................... 200/1 R, 5 R, 200/18, 175–181; 307/112, 115; 333/101–108; 340/824, 825–825.02, 826; 361/729, 735, 748, 784, 805; 370/56–60.1

[56] References Cited

U.S. PATENT DOCUMENTS

| | | | |
|---|---|---|---|
| 3,182,270 | 5/1965 | Horton | 333/105 |
| 3,372,349 | 3/1968 | Concelman | 333/105 |
| 3,404,374 | 10/1968 | Burrows et al. | 340/825.02 |
| 3,549,949 | 12/1970 | Granberry | 317/688 |
| 3,600,682 | 8/1971 | Yoshimoto | 370/16 |
| 3,699,295 | 10/1972 | Shinohara et al. | 200/175 |
| 3,808,566 | 4/1974 | Thompson et al. | 335/152 |
| 3,885,117 | 5/1975 | Owen | 200/175 X |
| 3,886,335 | 5/1975 | Hendricks | 200/1 R |
| 4,167,714 | 9/1979 | Flora | 333/101 |
| 4,507,627 | 3/1985 | Ito et al. | 333/105 |
| 4,584,543 | 4/1986 | Taylor, Jr. et al. | 333/103 |
| 4,591,949 | 5/1986 | Lahr | 361/731 |
| 4,872,212 | 10/1989 | Ross et al. | 361/818 |
| 4,873,613 | 10/1989 | Iversen | 361/699 |
| 4,935,709 | 6/1990 | Singer | 333/101 |
| 5,065,124 | 11/1991 | Chrzan | 333/246 |
| 5,111,200 | 5/1992 | Jasmer et al. | 340/826 |
| 5,155,724 | 10/1992 | Edwards | 370/37 |
| 5,206,712 | 4/1993 | Kornrumpf et al. | 361/729 |

OTHER PUBLICATIONS

IBM Technical Disclosure Bulletin, by E. M. Rutz; vol. 9 No. 9, pp. 1105–1106, Feb. 1967.

*Primary Examiner*—J. R. Scott
*Attorney, Agent, or Firm*—Eckert Seamans Cherin & Mellott; Richard V. Westerhoff

[57] ABSTRACT

The basic element of a modular, bidirectional broadband programmable switch system is a switch module having a thin rectangular housing with a single first connector preferably in the center of an elongated rear face and n second connectors equally spaced along the elongated front face. Broadband switches within the module selectively connect the single first connector with any one of the second connectors to provide an n×1 or 1×n switch. Up to n of the switch modules can be stacked side-by-side with an additional module extending transversely with its n second connectors connected to the first connectors on the stacked modules to provide an $n^2 \times 1$ or $1 \times n^2$ switch. The first connectors on the additional modules of two such stacks can be connected to provide an $n^{2 \times n2}$ switch. The switch modules contain a printed circuit board (PCB) on which the bidirectional, broadband switches, and in some instances splitters/combiners and/or couplers, are mounted in a tree configuration and connected by microstrip lines laid out in a candelabra pattern, both symmetric about a central axis, such that the paths between the single first connector and any of the second connectors all contain the same number of switches, splitter/combiners and couplers and the same path length to equalize impedance and insertion loss. The switches can be controlled locally or through various control interfaces, in the latter case preferably through an interface control board having connectors spaced apart to align with mating connectors on each of the modules in a stack. The signal connectors are inexpensive F-type connectors affixed to the edges of the PCB and projecting laterally outward. Matrices can be firmed by interlocking confronting notched edges of perpendicular arrays of spaced parallel PCB's with the strip lines on intersecting boards soldered directly to each other, thereby eliminating many cable connections.

24 Claims, 13 Drawing Sheets

MODULAR BROADBAND BIDIRECTIONAL PROGRAMMABLE SWITCH SYSTEM WITH STACKED MODULAR SWITCH ARRANGEMENT

BACKGROUND OF THE INVENTION

1. Field of the Invention

This invention relates to a modular switch system for bidirectional programmable switching of DC to several gigahertz signals.

2. Background of Information

Numerous switches have been designed for diverse applications. Typically, they are designed to operate within a specified frequency band. For instance, for control applications relays or logic are typically designed to operate from DC to about 3,000 Hz. For audio/video applications relays or integrated circuits (ICs) operate from 10 Hz to 10 MHz. For baseband (BB) and local area networks (LANs) mechanical switches, relays or ICs designed to operate from about 100 Hz to 100 MHz are typically used. For cable TV (CATV) and broadcast applications, mechanical switches, relays or diodes/ICs are used to switch signals in the 10 MHz to 550 MHz band. For master antenna television (MATV) and broad band cable (XCABLE) applications, a patch panel, relays or diodes/ICs are used to switch signals from 5 MHz to 1000 MHz. In satellite television receive only (TVRO), and multichannel multipoint distribution system (MMDS) applications, patch panels, coaxial switches, relays or diodes/ICs are used to switch signals in the 270 to 1750 MHZ and 1900 to 2300 MHZ bands, respectively. Finally, patch panels, specially designed electromagnetic relays, coaxial switches, diodes or monolithic microwave integrated circuit (MMIC) and applications specific integrated circuit (ASIC) based circuit elements are used to switch 1 to 40 GHz microwave signals. The switching devices or combinations of switching devices used for any particular application depends to a large extent upon the frequency band of interest, power levels of the switched signals, and the speed of switching required.

Although switches designed for any specific application have evolved to a high degree of performance and reliability, they are generally not adaptable for diversified application due to the use of different connectors, interfaces and connection requirements by the diverse users of the various frequency bands. Generally, switches designed to pass DC (direct current) are not suitable for RF (radio frequency) switching applications, and RF switches typically block DC. Switches designed for microwave applications are typically hundreds of times more expensive than an A/B selector switch such as used for a TV video game. Furthermore, different segments of the industry have adopted control systems for switching which are not compatible with those of other segments.

As frequency increases, the insertion loss increases, the isolation decreases and the return loss (impedance mismatch) increases, creating unwanted multiple reflections, transmission errors and increasing transmission loss. For these and other reasons, switches which are optimized for control functions are typically not suitable for higher frequency than audio or telephony, and switches optimized for the microwave spectrum, for example, such as the C-band terrestrial microwave and satellite downlink bands of 3,700 to 4,200 MHz (typically 50 ohm and using type N, BNC or SMA coaxial or waveguide connectors), will not work over the multi-octave CATV band of 30 to 450 MHz (typically 75 ohm and using type F connectors).

With the increasing proliferation of communications products and services, and the merging of the hereto largely independent telephony, video and digital technologies into a unified market place delivering voice, facsimile and data communications, interactive on-demand video home entertainment and consumer services over what is being referred to as the information superhighway, a growing need is evolving for switching capability covering all of these diverse technologies. With some 500 channels of video being planned, combined telephony, data and video delivery over the same medium (twisted pair, coaxial cable, fiber optics or RF), the rapidly growing availability for peripherals able to generate, process, scramble, decode, store, retrieve, transmit and receive this information stream is creating a need for low-loss, high isolation, bidirectional, broadband, programmable switches capable of selectively connecting and routing multiple signal sources to multiple output devices by direct routing or by switching a myriad of processing equipment into the loop.

SUMMARY OF THE INVENTION

These needs and others are satisfied by the invention which is directed to a modular, broadband bidirectional, programmable switch system. The basic building block of this system is a switch module which can switch any one, or all, of n signals of DC to several GHz to one output, or one such signal to any one or more of n outputs. The modules can be arranged in a multi-layer configuration, stacked and/or tiered, to provide a flexible switching capability. Each of the modules can be independently controlled either locally or by a central controller. Furthermore, the modules have a preset default condition which provides a predetermined path through each of the modules in the event of loss of control power.

More particularly, the modular bidirectional broadband, programmable switching system of the invention comprises a plurality of switching modules. Each of the switching modules has a housing with an elongated front face and an opposite, elongated rear face. A single first electrical connector is mounted in the elongated rear face and a plurality of second electrical connectors are mounted in spaced relation along the elongated front face. Circuit means within the housing provides for selectively electrically connecting the single first electrical connector with any one of the plurality of second electrical connectors for bidirectional transmission of signals through the module. For other applications the single first electrical connector can be selectively connected with more than one, or even all, of the second electrical connectors. A plurality of the switch modules can be stacked side-by-side with the first electrical connectors aligned to form a stack of switch modules. An additional one of the switch modules has its second connectors connected to the first connectors of the stacked switch modules. As up to n modules can be included in the stack, the result is an $n^{2\times 1}$ or $1\times n^2$ switch. Two such stacked subassemblies can be connected through the first connectors on the additional switching modules in each stack to provide an $n^2\times n^2$ switch. This matrixing is made possible by spacing the n second connectors along the front face of the module housing by a distance x which is as least as great as the thickness t of the housing. Additional modules, with or without switching capability, i.e., couplers, splitters or combiners in addition to switches, can be connected to either the first or second connectors of the switching modules. These additional modules can have the same or a different number of second connectors. Thus, it is clear that, in addition to stacking (placing the modules side-by-side), the modules can also be tiered (connected serially), either as individual modules, stacks of modules or a mixture of individual modules and stacks of modules.

As mentioned, the switches in the switching modules can be controlled either locally or from a central controller. Local control can be effected, for instance, by DIP switches or other types of switches, such as for instance, a telephone key pad, and suitable interface either mounted directly on the modules or on a local control panel. Where remote control is used, control leads for each of the switches within the module am connected to a control lead connector. The control lead connectors on each of the modules are aligned on a common face of the module, preferably on the rear face, so that an interface bus having spaced apart interface connectors can be aligned and mated with the control lead connectors of all of the switching modules in a stack. This interface bus and the interface connectors can be mounted on a printed circuit board spanning the stack.

The circuit means for selectively connecting the first electrical connector to any one of the plurality of second electrical connectors within a switching module comprises electrical branching elements (switches, splitters/combiners, couplers) and electrical leads connecting the electrical connectors and the electrical branching elements, all arranged to form electrical paths between the first electrical connector and each of the second electrical connectors such that each path has an equal number of electrical branching elements and a substantially equal total length of electrical leads. This assures that the insertion loss and the impedance are the same for each of the switching paths through the module. The electrical branching elements are mounted on a circuit board within the housing in a tree configuration with each of the second electrical connectors connected to an electrical branching element in a common level of the tree configuration. In addition, the electrical leads connecting the electrical branching elements and the first and second connectors are microstrip lines on the circuit board. The first electrical connector of each of the switching modules is preferably substantially centered along the elongated rear face of the housing and the symmetrical tree configuration of the electrical switches is symmetrical about a central axis passing through the first electrical connector. The microstrip lines fan out from the first connector to the symmetrical tree configuration of electrical switches in a symmetrical candelabra pattern. As the microstrip line between the first connector and the first electrical switch in the tree configuration is common for all of the paths, the first connector need not be centered on the rear face of the module, and in fact could even be located on the front face along side of, or in place of one of, the second connectors, such as where a full complement of second connectors is not needed. The switches all have a fixed switch position when unpowered so that the module has a predetermined default path through the module when control power is lost.

As another aspect of the invention, numerous cable connections can be eliminated by an arrangement which includes a first array of spaced apart PCBs each having a first coaxial connector and a plurality of electrical branching elements connecting the connector to any one or more of a plurality of first interface leads extending to a first edge of the PCB. A second, similar array of PCBs also each have a plurality of electrical branching elements connecting a second coaxial connector to any one or more of a plurality of second interface leads extending to a first edge of the PCB. The second array of PCBs is arranged transverse to the first array with the first edges of the boards of the two arrays confronting each other and with a second interface lead on each second PCB contacting and electrically joined to a first interface lead on a different one of the first PCBs to form a plurality of selectable electrical paths between each first coaxial connector and each second coaxial connector. More particularly, the confronting edges of the PCBs of one, or both, of the two arrays are notched to interlock the boards. The electrical branching elements can be selected to make blocking (an input connecter can only be connected to one output connector) matrices or non-blocking (an input connector can be connected to more than one output connector or multiple input connectors can be connected to any output connector) matrices.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
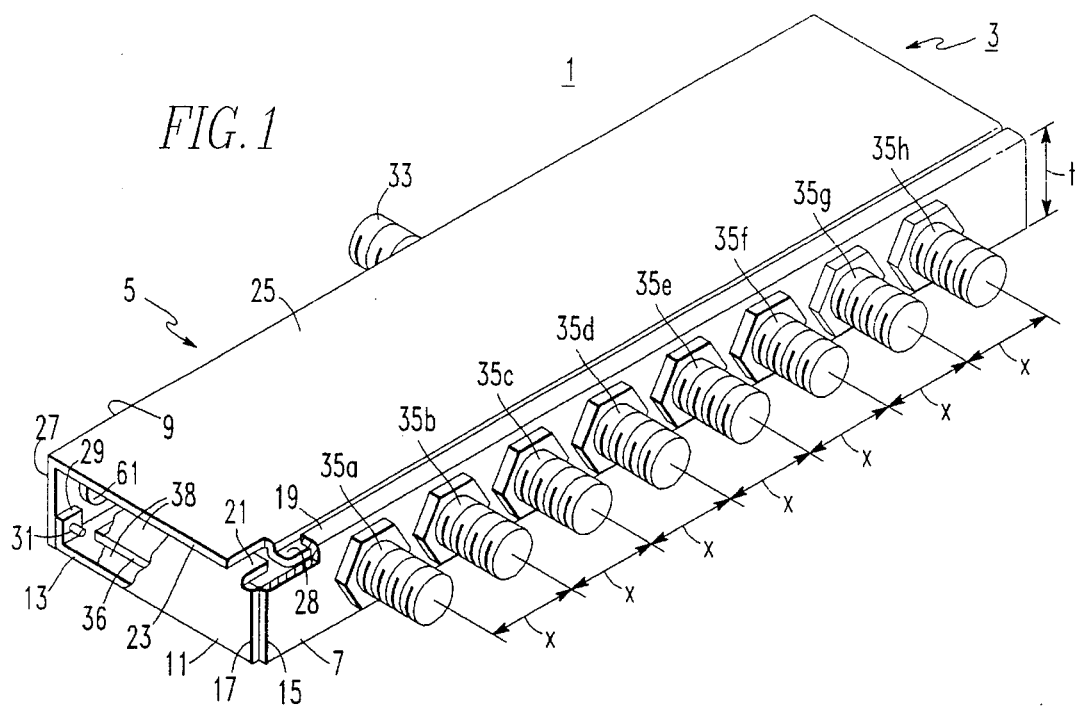
FIG. 1 is an isometric view, with some parts cut away, illustrating the switch module which forms a basic building block of the invention.
Figure 2:
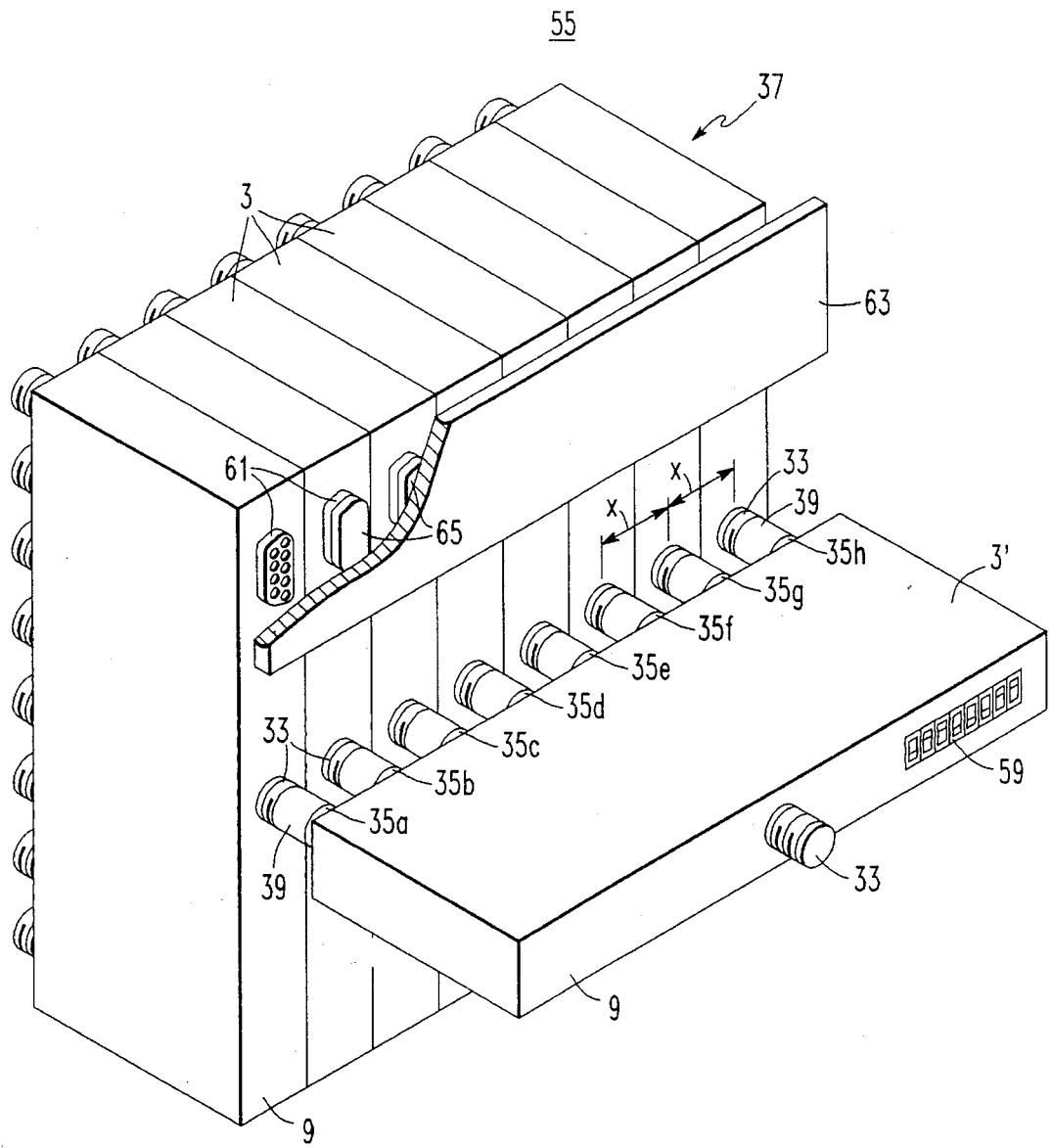
FIG. 2 is an isometric view of an assembly made up of a stack of the switch modules illustrated in FIG. 1 connected by a transverse additional switch module.

The modular, bidirectional broadband programmable switch system 1 of the invention utilizes the switch module 3 illustrated in FIG. 1 individually, and in an assembly such as shown in FIG. 2, as a basic building block. The switch module 3 includes an elongated, rectangular parallelpiped housing 5 having an elongated front face 7 and opposite elongated rear face 9. In the exemplary switch module 3, the housing 5 is fabricated from two pieces of sheet metal. The first piece 11 forms the bottom wall 13, the integral front wall 15 and side walls 17. The tops of the front wall 15 and side walls 17 are bent inward to form flanges 19 and 21, respectively. A second metal sheet 23 is bent to form the top wall 25 and rear wall 27. The top wall 25 has an offset lip 28 which engages under the flange 19 along the front wall 15. The rear wall 27 is secured to integral upturned tabs 29 on the bottom wall 13 by sheet metal screws 31.

A single first electrical connector 33 protrudes from the center of the elongated rear face 9 formed by the rear wall 27. A plurality (8 in the exemplary switch module 3) of second electrical connectors 35a to 35h are evenly spaced on the front face 7 of the housing 5. It will be appreciated that there can be any number of second connectors 35 greater than 1 spaced along the front face 7 of the housing 5. Accordingly, at times the plurality of second connectors 35 will be referred to as n, where n is at least equal to 2. Various types of connectors could be used for the first electrical connector 33 and the second electrical connectors 35. In the exemplary switch module 3, the connectors 33 and 35 are low cost type F coaxial RF connectors. Any other type of coaxial connector could be used, such as for example, BNC, N, UHF, TNC, or RCA.

The elongated housing 5 has a thickness, t. For reasons which will become apparent, the second electrical connectors 35 are equally spaced along the front face 7 by a distance, which is as least as great as t. As will be discussed in detail, within the housing 5 are circuits on a printed circuit board (PCB) 36 which include switches which permit the single first electrical connector 33 to be connected to any one of the n second electrical connectors 35. The switches used are bidirectional so that alternatively a signal applied to any one of the n second electrical connectors 35 can be switched to the single first connector 33. Thus the switch module 3 can be used as a 1×n or an n×1 switch. Volumetric signal absorbing material can be placed inside housing 5 to suppress any radiation or resonances which may be generated inside the enclosure within the frequency band of interest.

Figure 3:
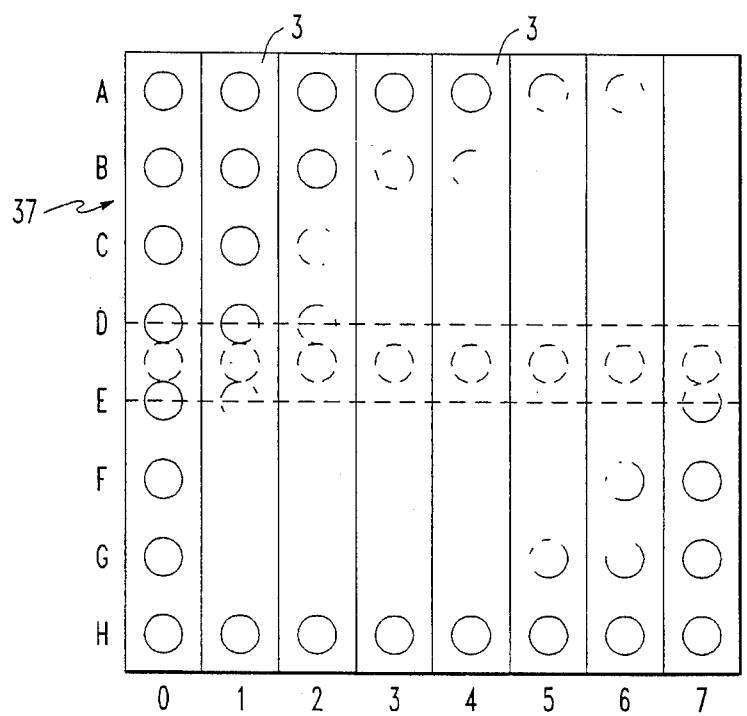
FIG. 3 is a front plane view of the assembly of FIG. 2.

As can be seen in FIGS. 2, and 3 a plurality of a switch modules 3 can be stacked side by side to form a stack of modules 37 having all of the first electrical connectors 33 aligned. Since, as mentioned above, the thickness of the modules 3 is equal to t, the modules in the stack can be aligned such that the distance between the first electrical connectors 33 of adjacent switch modules 3 in the stack 37 is equal to x which is the spacing between the second connectors on each switching module. Thus, the second electrical connectors 35a through 35h of an additional switch module 3', when oriented transverse to the stacked modules 3, will align with the first electrical connectors 33 of the stacked modules.

Figure 4:
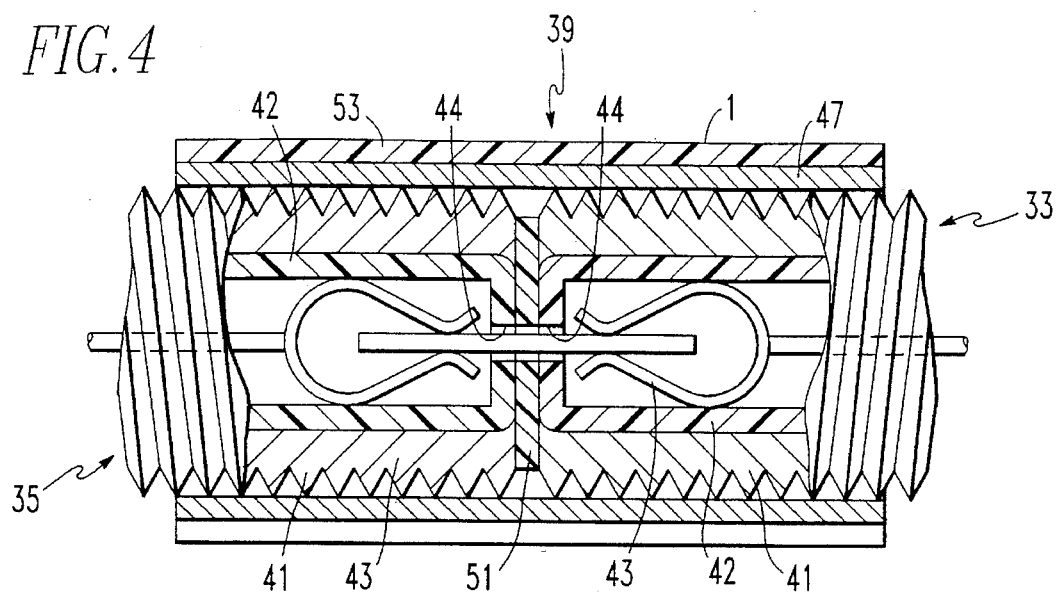
FIG. 4 is a longitudinal sectional view through a male connector used to join the switch modules forming the assembly of FIG. 2.

As the center conductor of a coaxial cable normally forms the male connection for a type F connector, a double male connector 39 is used to connect the second electrical connectors 35 of the additional module 3' to the first electrical connectors 33 of the stacked modules as shown in FIG. 2. The details of the double male connector 39 are illustrated in FIG. 4. As can be seen there, the type F first electrical connectors 33 and second electrical connectors 35 comprise a cylindrical, externally threaded tubular conductor 41 which forms the ground lead, and a central spring clip connection 43 which forms the other lead. These leads are separated by an insulator 42 having a central aperture 4A providing access to the spring clips. The double male connector 39 includes a pin 45 which is received in each of the spring clips 43 of the electrical connectors 33 and 35. The outer conductor of the connector 39 comprises a longitudinally split metallic sleeve 47 which can be push fit over the threaded external conductors 41 of the connectors 33 and 35. Annular dielectric tuning rings 51 can be provided on the pin 45 as required. A dielectric insulating sleeve 53 is provided over the metal sleeve 47.

It is obvious that the plurality of switch modules 3 in the stack of modules 37 can be anywhere from 2 to n. Where n modules are stacked side-by-side, the assembly 55 shown in FIGS. 2 and 3 becomes a 1×$n^2$ or an $n^2$×1 switch.

Figure 5:
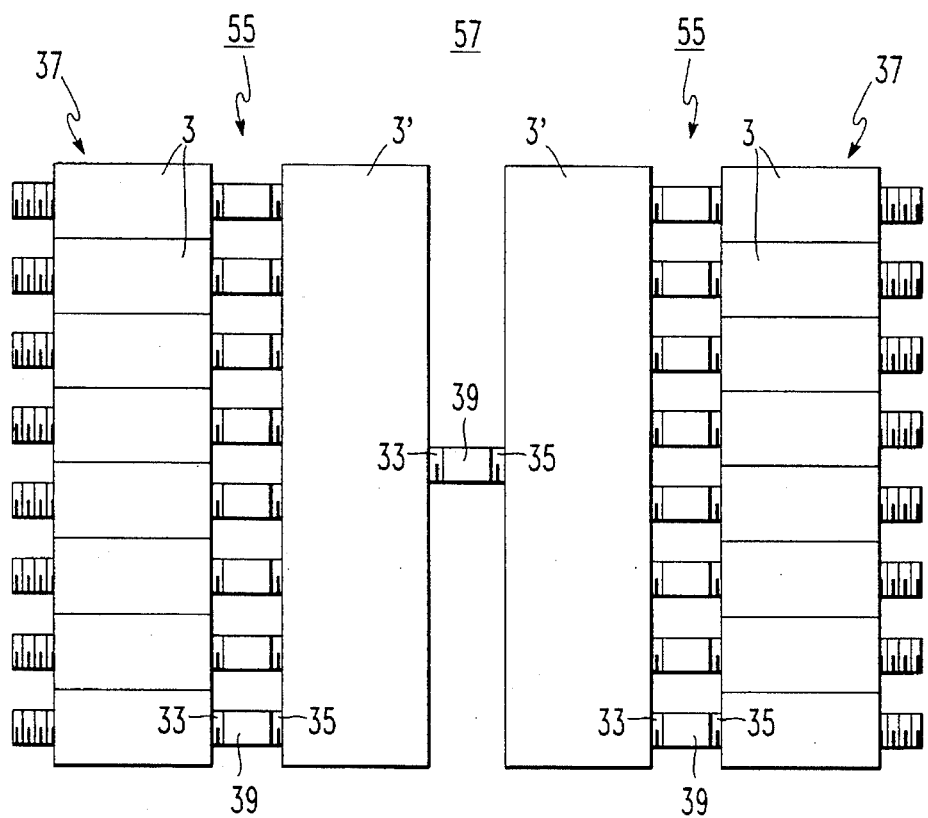
FIG. 5 is a plan view of a larger assembly of two of the assemblies shown in FIG. 2 connected back-to-back.

As shown in FIG. 5, two of the assemblies 55 can become subassemblies in a larger assembly 57. Where n switch modules 3 are used in the stacks 37 of each of the sub assemblies 55, the assembly 57 becomes an $n^2$×$n^2$ switch. Generically, where the plurality of modules 3 in the stack 37 of the first sub-assembly 55 is r and the plurality of switch modules 3 in the second sub-assembly 55 is s, the switch 57 becomes an (n×r)×(n×s) switch, where r and s are no greater than n and can be equal or unequal.

As mentioned, the switches in the switch modules 3 and 3' can be controlled locally or remotely. For local control, the switches within the switch modules can be controlled by DIP switches 59 or other suitable switches such as push buttons or rotary switches mounted in the housing 5, for example, in the rear face as shown in the case of the switch module 3' in FIG. 2. Alternatively, these switches could be mounted on a remote control panel. Furthermore, other remote switching arrangements could be used as discussed below. For remote control, module connectors 61 such as 9 pin D-9 connectors are provided in preferably the rear face 9 of the switch modules 3 so that the connectors 61 of all of the switch modules 3 in the stack 37 are aligned. A control interface bus on printed circuit board (PCB) 63 has an equal number of D-9 bus connectors 65 spaced apart by the distance x which mate with the connectors 61 on the individual modules. The control interface PCB 63 may have individual control leads (not shown) for each of the connectors 65 or may comprise a bus daisy chained to each of the connectors 65. The PCB 63 connects the modules to an external source of control signals (not shown). This example of re,note control for the switch modules 3 in the stack 37 and local control for the switch module 3' is for illustration only, and it should be understood that any or all of the modules can be controlled either remotely or locally.

Figure 6:
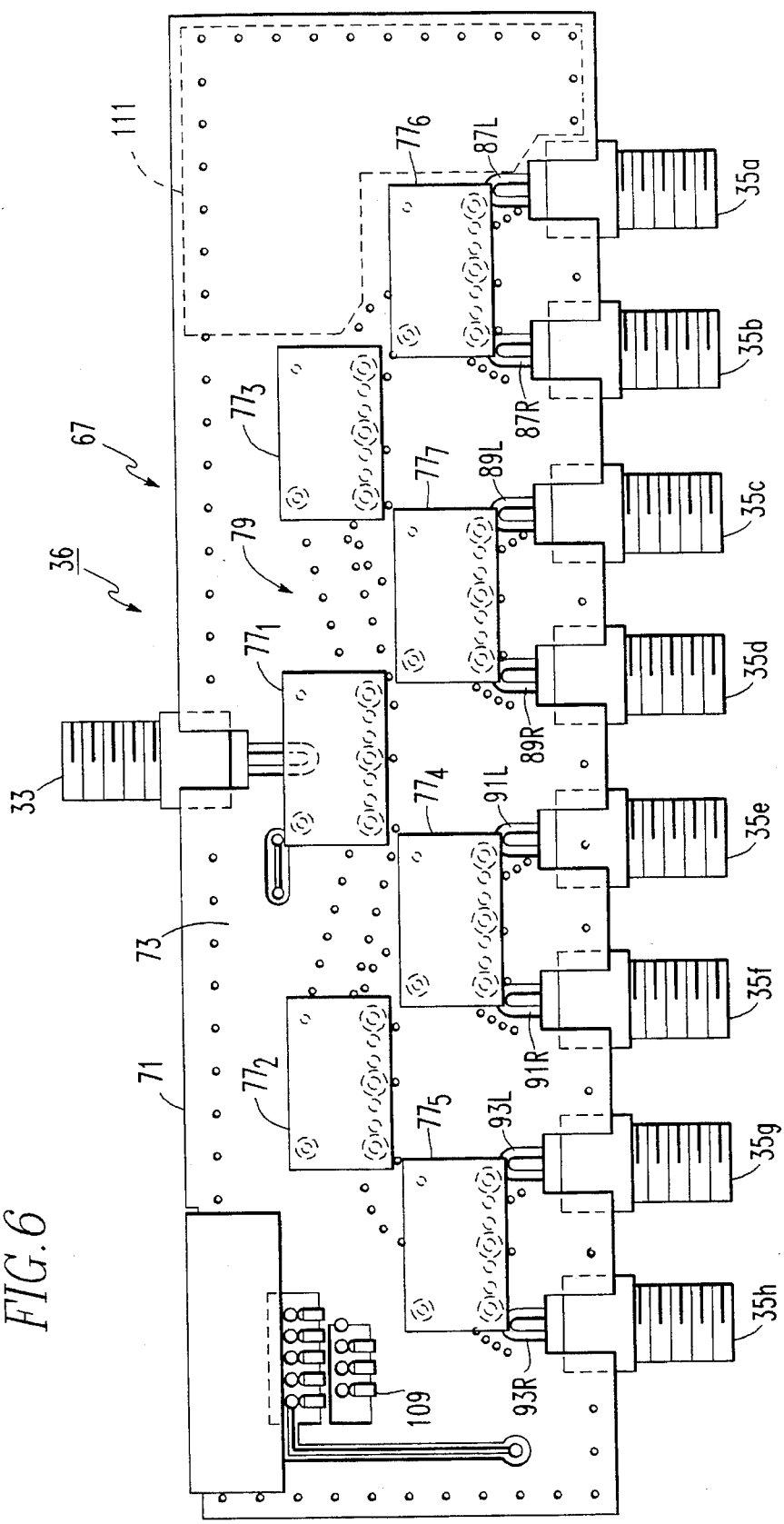
FIG. 6 is a plan view of the component side of a printed circuit board which is pan of,the switch module of FIG. 1.
Figure 7:
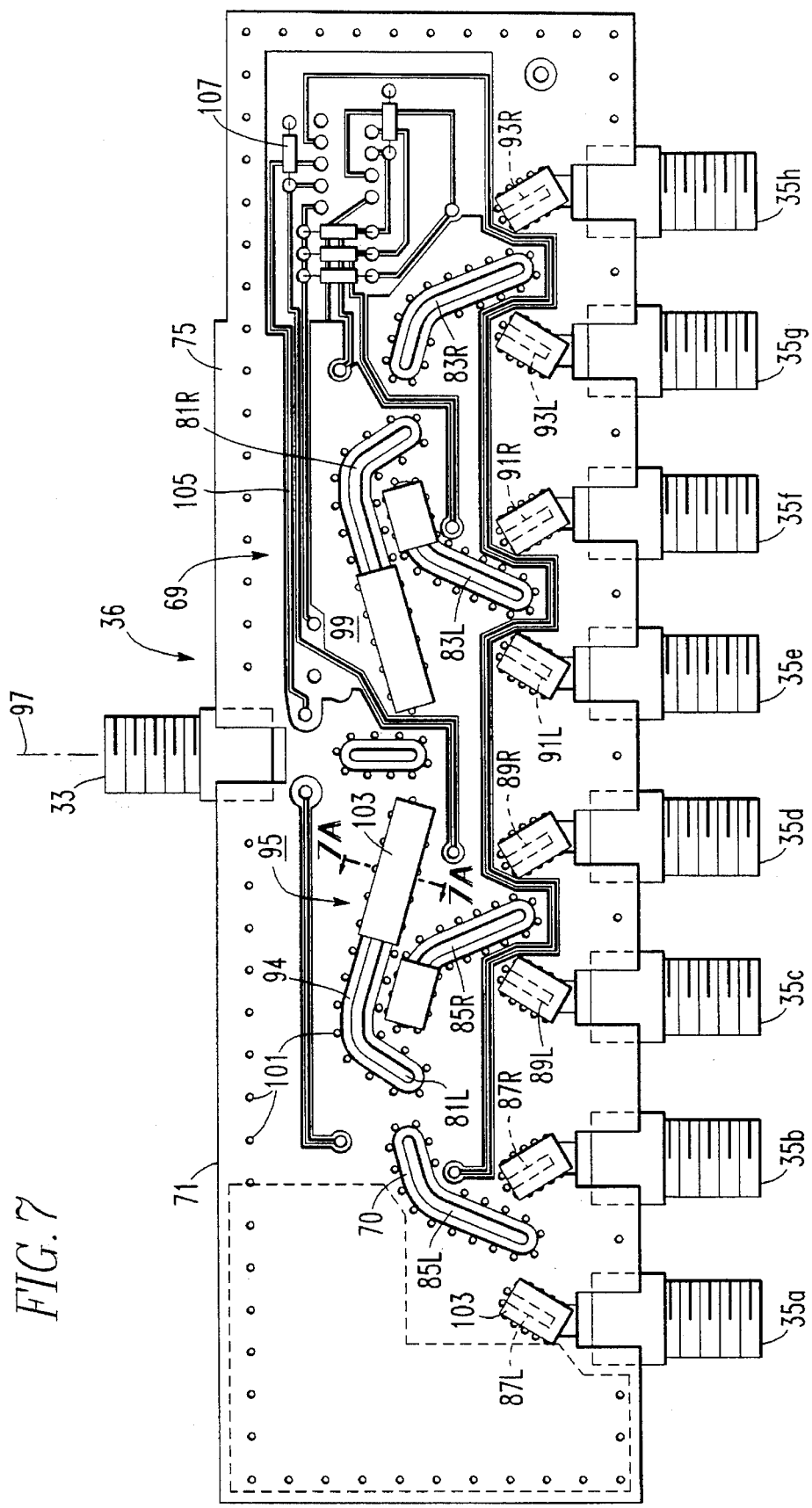
FIG. 7 is a plan view of the RF plane side of the printed circuit board of FIG. 6.
Figure 7A:
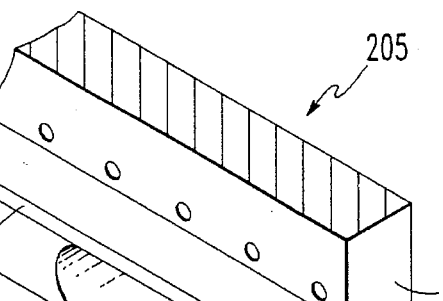
FIG. 7A is a fractional cross-section through the printed circuit board of FIG. 7 taken along the lines 7A—7A.

FIGS. 6 and 7 illustrate the component side 67 and RF plane side 69 of the PCB 36 which is mounted inside the housing 5 of the modules 3 and 3'. The PCB 36 comprises a substrate 71 having grounded conductive planes 73 and 75 on the component side 67 and RF plane side 69, respectively. Referring to FIG. 6, a plurality of switches $77_1$ through $77_7$ are mounted on the component side 67 of the PCB 36 in a tree configuration 79 with the switch $77_1$, forming the base and the switches $77_4$–$77_7$ forming the top of the tree. The outer conductor of all of the connectors 33 and 35 are connected to the ground planes so that only the inner conductor is switched. Thus, the switches 77 are single pole, double throw switches. In the exemplary switch module, the switches are broadband relays such as Omron type G5Y-1-8 relays. Any other suitable broadband relay may be utilized. When higher switching speed is required, or other special requirements exist; solid state switching elements such as PIN diodes or digital multiplexes can be substituted for relays, with appropriate modifications to the printed circuit, including B+ on D-9 PIN 1.

Figure 8:
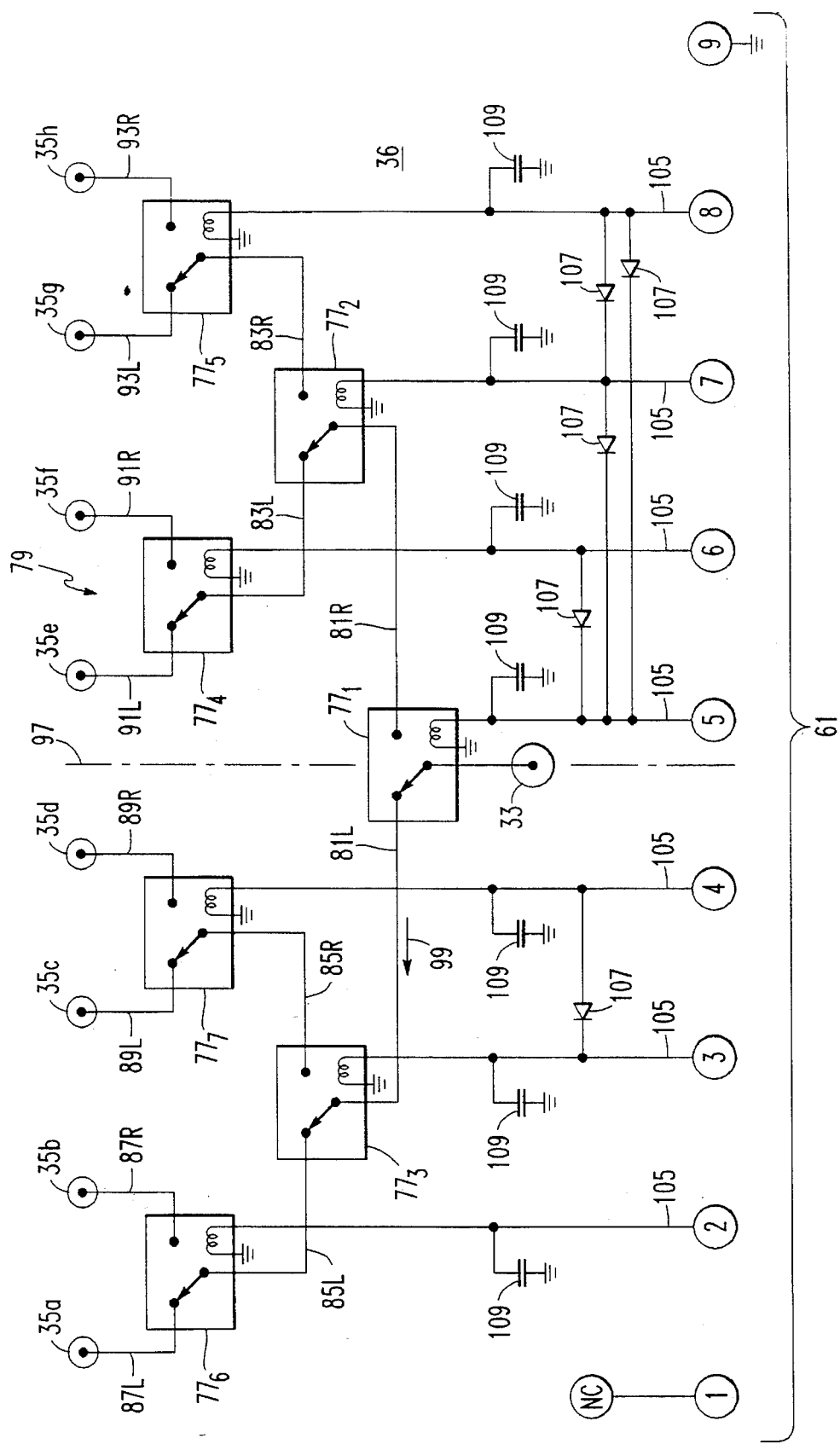
FIG. 8 is a schematic circuit diagram of the printed circuit-board of FIGS. 6 and 7.

The switching arrangement and the tree configuration 79 of the switches 77 can best be appreciated frown the circuit diagram of FIG. 8. As shown there, the first connector 33 on the rear of the switch module 3 is connected to the switch 77₁. Depending upon the state of the switch 77₁ the connector 33 can be connected with either switch 77₂ or 77₃ through leads 81ᵣ and 81ₗ respectively. The switch 77₂ can direct the signal to either the switch 77₄ or 77₅ through the leads 83ₗ and 83ᵣ respectively, while the switch 77₃ selectively directs the signal to either switch 77₆ or 77₇ through leads 85ₗ or 85ᵣ. The switches 77₄ through 77₇ then direct the signal to a selected one of the connectors 35ₐ through 35ₕ through the appropriate right or left leads 87–93. In the exemplary switch modules 3, the relays 77₁ through 77₇ have a normally closed and a normally open set of contacts so that the connector 33 is always connected to one of the connectors 35ₐ through 35ₕ. In the circuit illustrated in Figure 8, the default condition connects the connector 33 to the connector 35ₐ. Thus, if control power is lost, or on command, there is always a predictable path through the module. It can be seen from FIG. 8, that the path 99 between the connector 33 and any of the connectors 35ₐ and 35ₕ includes an equal number, 3, of switches 77.

Returning to FIGS. 6 and 7, it will be seen that the leads 81–93 are in the form of microstrip lines 94 laid down on the PCB 36. These microstrip lines are isolated from the ground plane 69 by gaps 70 in the ground plane. As can be seen by the physical layout illustrated in FIG. 7, the strip lines 94 form a candelabra pattern 95 which is symmetrical about a central axis 97 passing through the switch 77₁, so that all paths 99 between the connector 33 and any of the connectors 35ₐ to 35ₕ have the same total length of strip line 94 and the same number of switches. With this arrangement then, the impedance and insertion loss for all paths 99 through the switch module 3 are reasonably the same no matter which of the connectors 35ₐ to 35ₕ is connected to the connector 33.

RF isolation of the microstrip lines 93 is enhanced by a series of plated through holes 101 connecting the edges of the ground planes 73 and 75 along each side of each microstrip line 94 and around the periphery of the PCB 36. This is a known technique for transmitting microwave frequency signals on PCBs with minimum dielectric losses and radiation leakage. Where necessary, such as where microstrip lines come particularly close to one another, longitudinally split tubular shields 103 are soldered to the ground plane over the microstrip line 94. For specific bandwidth applications, circuit elements can be custom tuned for the actual bandwidth used. Performance at frequencies greater than 2 GHz can be improved by using lower dielectric loss materials, such as for example, Teflon-glass or ceramic, for the substrate 71 of the PCB 36. Due to the multiple paths possible, and the broad frequency band, certain frequencies may create resonances within the enclosure 5. Such resonances may be suppressed by the addition of the RF/microwave volumetric absorber material 38 placed in the housing 5, typically adjacent end walls 17 as shown in FIG. 1.

As discussed above, control of the switches 77 on the PCB 36 can be local and/or remote. In the exemplary switch module 3, the switches 77 are remotely controlled through the interface board 63 which connects to the module connector 61. (See FIG. 2). As shown in FIG. 8, the coil of each of the relays 77₁14 77₇ is connected to one of the pins 2–8 of the D-9 connector 61 through a control lead 105. A DC control voltage is applied to the pin of the connector 61 associated with the connector 35ₐ through 35ₕ which is to be connected to the connector 33. For instance, if connector 35ᵦ is to be connected to the connector 33, the control voltage is applied to pin 2 of the control connector 61. This operates relay 77₆ which is the only relay which need be energized in this case since the switches 77₁ and 77₃ are defaulted to the appropriate position. When others of the connectors 35 are to be connected to the connector 33, more than one of the relays 77 must be energized. The diodes 107 provide for actuation of the additional switches. For instance, when connector 35ₕ is to be connected to the connector 33, the control voltage is applied to pin 8 of the connector 61. The switch 77₅ is thus directly energized and the switches 77₂ and 77₁ are energized through the diodes 107. The pin 1 of connector 61, which is associated with the connector 35ₐ, does not energize any of the relays 77 as the unactuated condition of all of the switches is effective to connect connector 35ₐ to the connector 33. Pin number 9 on the connector 61 is connected to ground. Pin 1 is reserved for DC voltage for on PCB control circuits when required. The capacitors 109 suppress RF on the control lines.

Returning to FIG. 7, the control leads 105 are laid down on the PCB 36 and the diodes 107 are mounted on the RF plane side 69 while the capacitors 109 are mounted on the component side 67 of the PCB 36 as shown in FIG. 6.

As an alternative to the illustrated control scheme, the switch modules 3 can be remotely controlled through logic/digital circuitry (indicated generally at 111) provided on the PCB 36 to interface with RS-232, RS-422, RS-485, IEEE-488 or HPIB protocols, or any other custom interface. The logic/digital circuits 111 would be connected to the pins on the control connector 61 to decode the control signals received from the interface and to energize the appropriate lead 105. This is preferred over the alternative of having separate leads on the interface board connected to each of the control leads.

Figure 9:
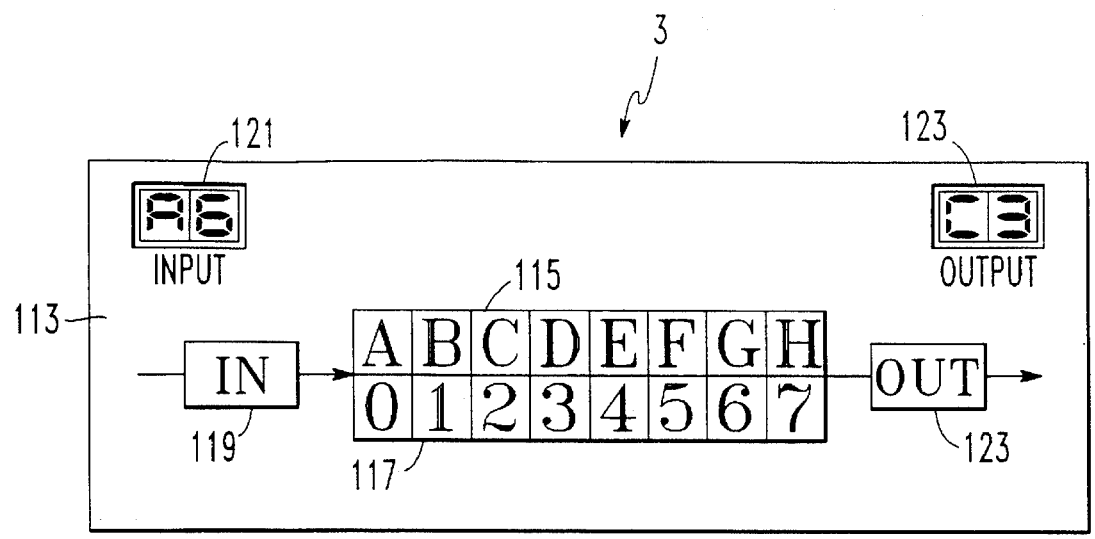
FIG. 9 is a front view of a control panel for controlling a switch in accordance with the invention.

For local control, the dip switches 59 could be individually connected to one of the leads 105 in place of the pins of the control connector 61. In that event, DC power would be supplied to the DIP switch via pin 1. An alternative local control arrangement for an assembly such as the 64×64 matrix 57 is illustrated in FIG. 9. The control panel 113 includes a first series of push button switches 115 labeled "A" through "H", and a second set of push button switches 117 labeled "0" through "7". The appropriate switching path is selected by pressing "IN" button 119 and then one of the switches 115 and one of the switches 117 designating the x-y coordinants of the input connector. The selected input connector is displayed by the input indicator 121. Then, "OUT" switch 123 is depressed followed by the appropriate switches 115 and 117 for the x-y coordinants of the selected output connector. The selected output connector is displayed in the output indicator 125.

Figure 10:
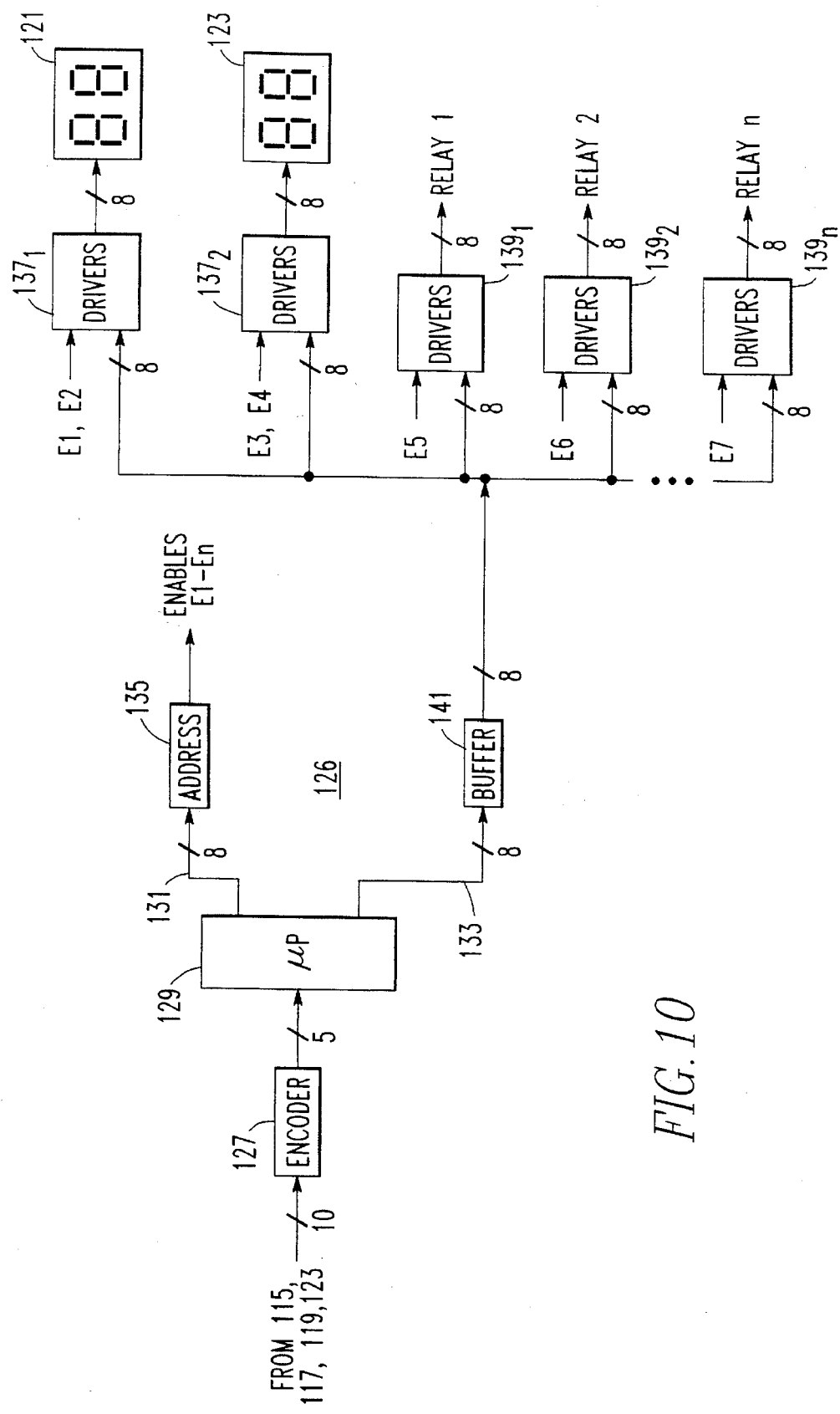
FIG. 10 is a schematic circuit diagram in block form of the control panel shown in FIG. 9.

FIG. 10 is a block diagram of a microcomputer based control circuit 126 for the control panel 113 illustrated in FIG. 9. The keystrokes from the switches 115, 117, 119 and 123 are digitally encoded by the key encoder 127 for input to a microprocessor 129. The microprocessor 129 determines the switch to be actuated frown the keypad inputs, and outputs the address of that switch on an address bus 131 and the actuation command on a data bus 133. An address decoder 135 enables drivers 137₁ and 137₂ for the input display 121 and output display 125, respectively, and the drivers 139₁ to 139ₙ for actuating the relays in the module. The command for actuating the switch is buffered by buffer

141.

Figure 11:
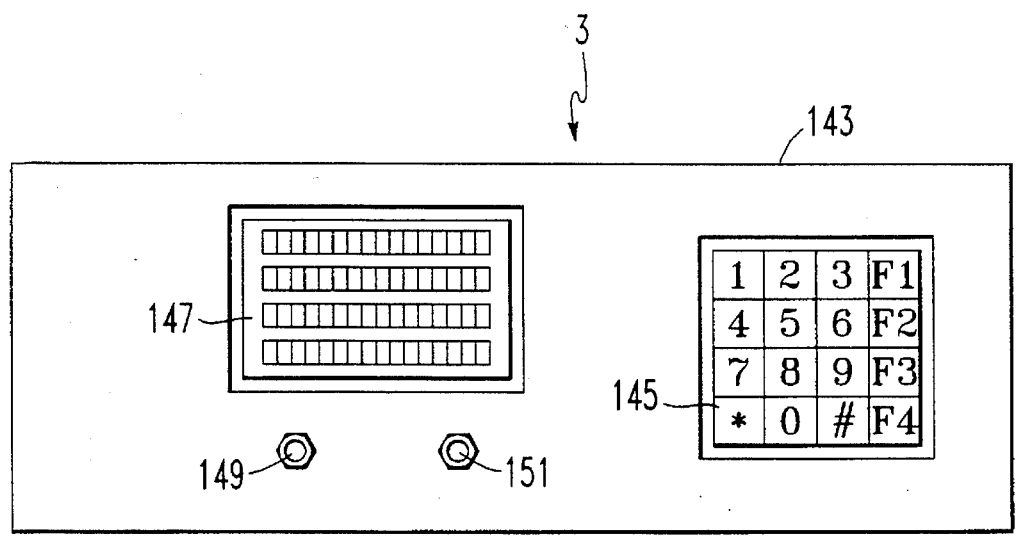
FIG. 11 is a front-view of another embodiment of the control panel.

Another control panel 143 for local or remote control of a module 3 is illustrated in FIG. 11. This control panel utilizes the standard Dual Tone Multi-Frequency (DTMF) keypad 145. A multi-line LCD display 147 provides instructions for programming the module and displays the selected inputs. For instance, the display could provide a message "select input" after which the user would enter the designator for the selected input. Jacks 149 and 151 are provided for porting control in from a remote location or porting the selection out to a remote location, respectively.

Figure 12:
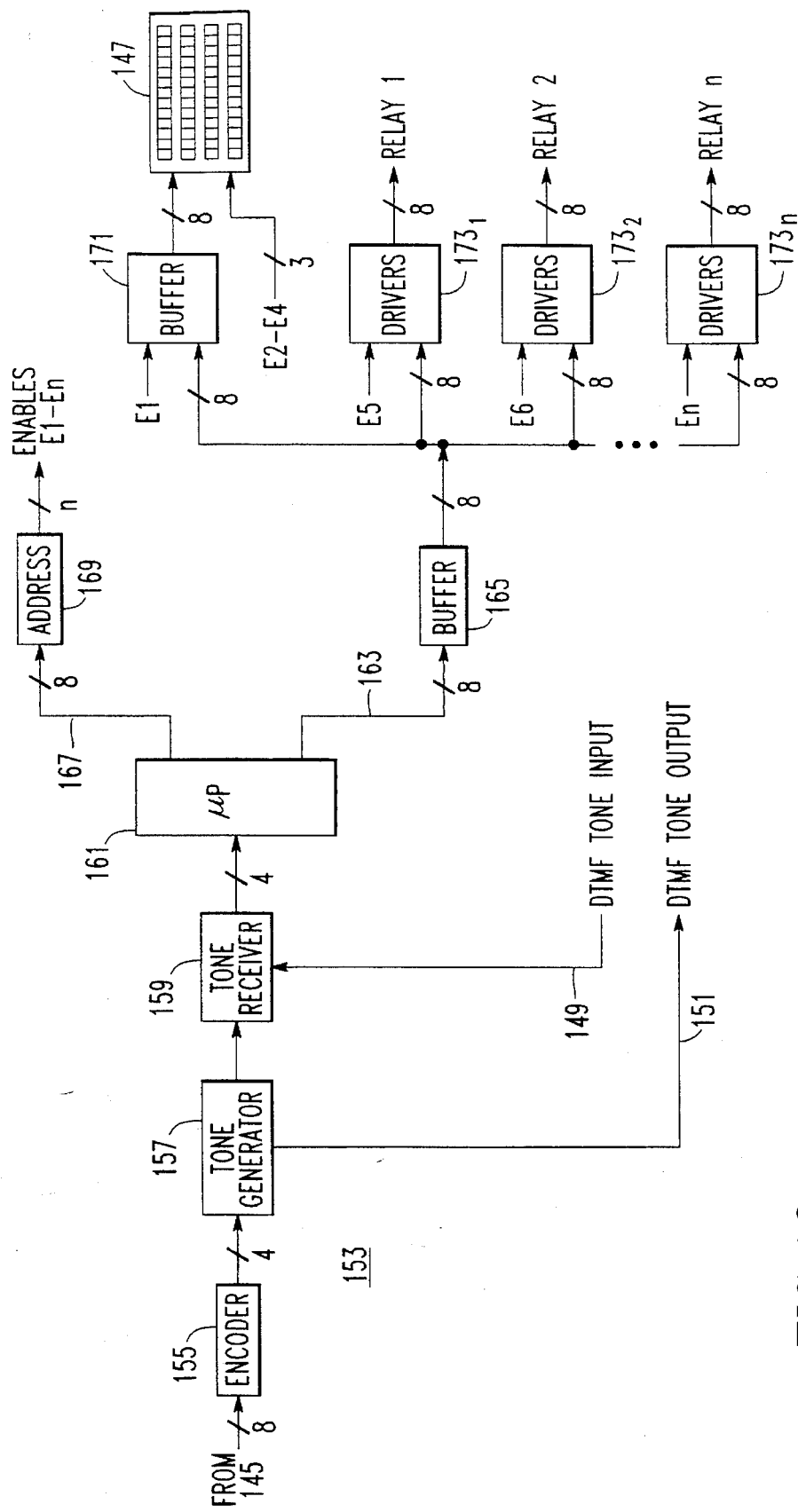
FIG. 12 is a schematic circuit diagram in block form of the control panel of FIG. 11.

FIG. 12 illustrates the control circuit 153 for the control panel 143. The keystrokes from the keypad 145 are encoded digitally by the encoder 155. A DTMF tone generator 157 generates from the digitally encoded keystrokes a DTMF tone signal which can be output through the jack 151 and is also applied to a DTMF receiver 159. The receiver 159 also can receive remote signals through the jack 149. These tone signals are decoded and applied to a microprocessor 161 which implements a routine for generating instructions to be displayed on the LCD display 147, and responds to the inputs from the keypad 145 to initiate actuation of the required relays and generation of the appropriate display. Instructions from the microprocessor 161 are transmitted over a data bus 163 having a buffer 165 with the address portion being transmitted over an address bus 167 to an address decoder 169. The address decoder 169 enables a buffer 171 for storing data for the display 147. It also enables the drivers $173_1$ to $173_n$ which actuate the relays of the switching array.

Figure 13:
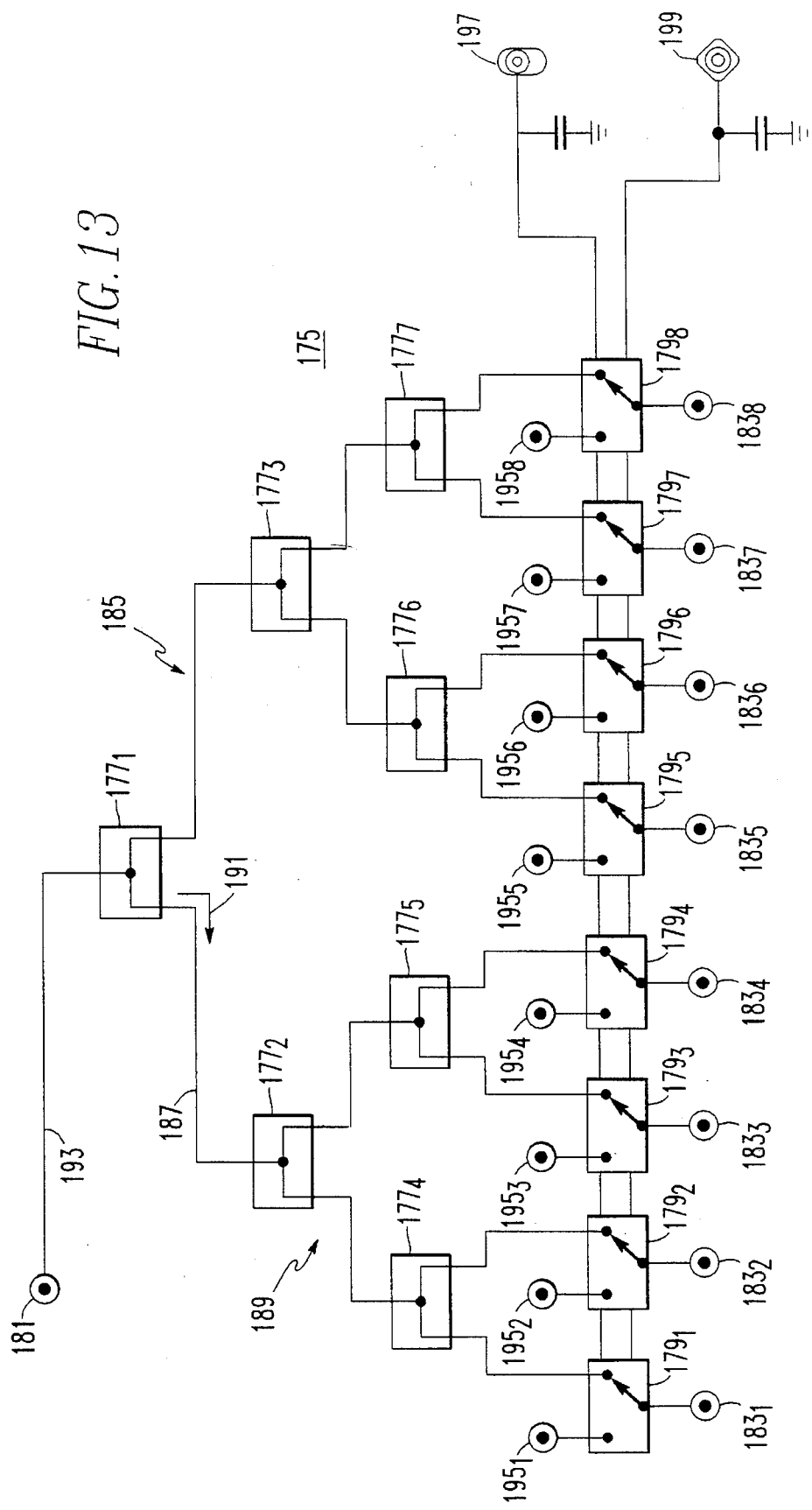
FIG. 13 is a schematic diagram in block form of another embodiment of a switch module in accordance with the invention.

The module shown in FIGS. 6–8 can be used to construct blocking matrices. In a blocking matrix, any individual input can only be connected to a single output at a time. The switching modules of the invention can also be used to build non-blocking matrices. FIG. 13 illustrates an example of a module in accordance with the invention which can be used in a non-blocking matrix. This module has electrical branching elements which include two-way dividers 177 and two position switches in the form of relays 179. The two-way dividers 177 are splitters, or combiners, depending upon the direction of signal transmission. The two-way dividers 177 and relays 179 connect a single first connector 181 with any one or more of second connectors $183_1$ to $183_8$. These electrical branching elements 177 and 179 are arranged in the tree configuration 185 and connected by electrical leads 187 laid out in a candelabra pattern 189 to form a plurality of paths 191 each of which has three 2-way dividers 177, one switch 179 and the same length of lead 187. As can be appreciated from FIG. 13, the first connector 181 can be located anywhere on the module as the section 193 of the leads between the connector 181 and the switch $171_1$ forming the base of the tree configuration is common to all of the paths 191 through the module.

The module of FIG. 13 includes a second set of second connectors $195_1$ to $195_8$ connected to the relays $179_1$ to $179_8$. With the relays 179 deenergized the connectors 183 are switched to the single connector 181. On the other hand, when the relays 179 are energized all of the connectors 183 are connected to the connectors 195. Such a module is useful, for instance, where it is desired trader certain circumstances to transmit a common signal to all outputs in place of individual nodal signals. An application of this would be in a studio where an emergency broadcast signal supplied to the connector 181 could quickly and automatically replace all of the variety of individual signals being transmitted to the outputs. Thus, under normal circumstances, all of the relays $179_1$ to $179_8$ would be energized such as by power applied through power input terminals 197 and 199. This would connect all of the connectors $183_1$ to $183_8$ to the signals provided through the connectors $195_1$ to $195_8$. In an emergency, the power to the relays is removed and all of the connectors $183_1$–$183_8$ receive the signal input to the connector 181. All of the connectors 181, $183_1$ to $183_8$ and $195_1$ to $195_8$ are preferably F type connectors.

Figure 15:
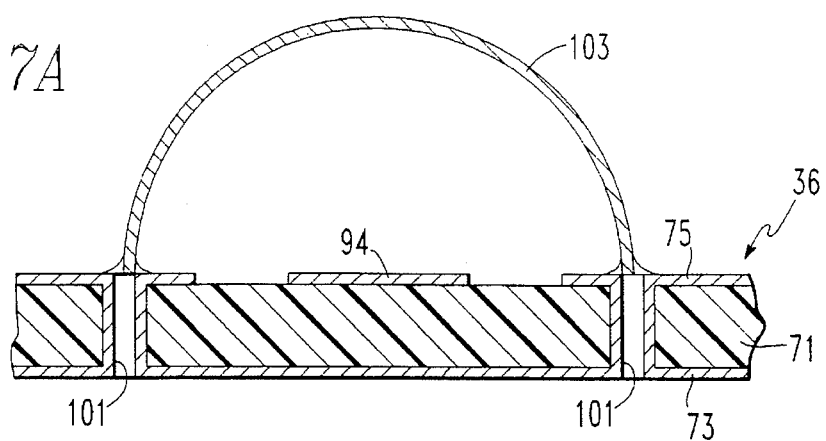
FIG. 15 is a fragmentary isometric view of a portion of the switching matrix of FIG. 14 shown in enlarged scale.
Figure 15:
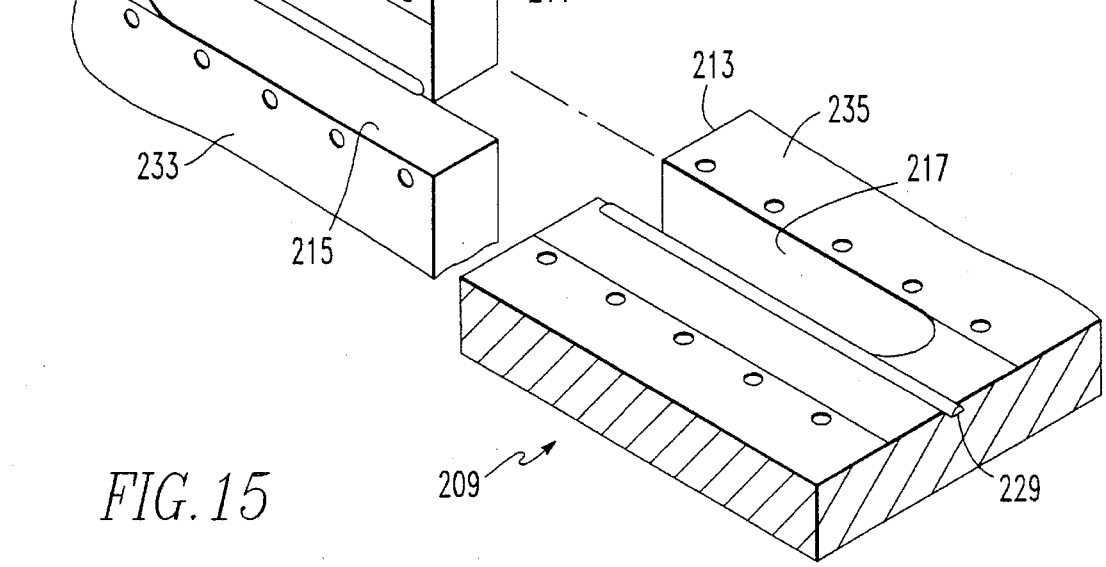
Figure 14:
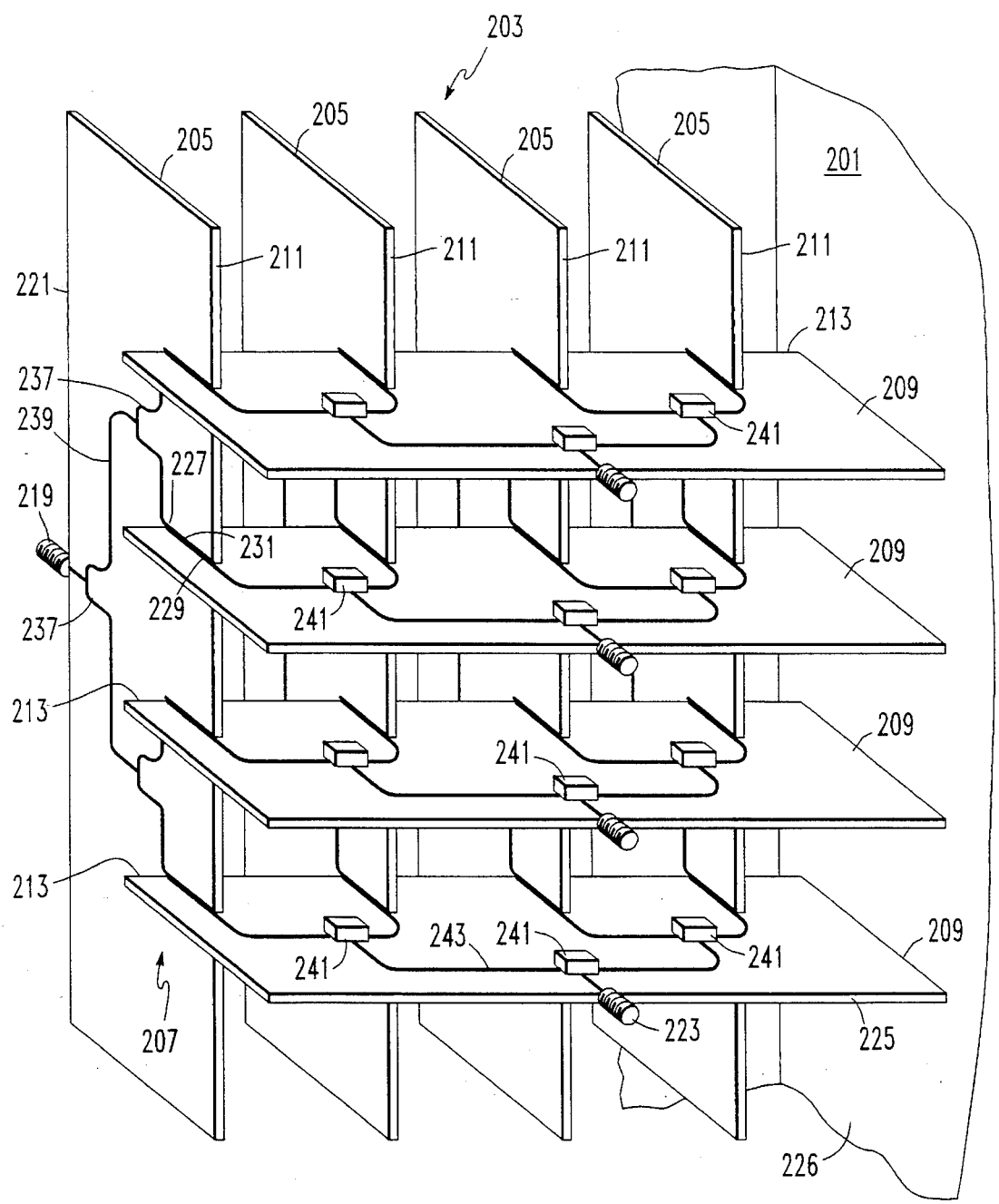
FIG. 14 is an isometric view of a switching matrix in accordance with the invention.

FIGS. 14 and 15 illustrate another aspect of the invention. A switching matrix 201 can be constructed from the printed circuit boards of the modules without the individual module housings or the interfacing connectors. As shown in FIG. 14, a first array 203 comprises a number of first PCB's 205 in spaced parallel arrangement. A second array 207 includes a plurality of second PCB's 209 also arranged in spaced parallel relation, but perpendicular to the PCB's 205 of the first array. The confronting edges 211 and 213 have slots 215 and 217 respectively extending into the PCB and perpendicular to the edge. The two arrays 203 and 207 are interlocked by engagement of these slots, somewhat in egg crate fashion. The PCB's 205 of the first array 203 each have a, preferably, F type connector 219 on the edge 221 opposite the edge 211. Similarly, each of the PCB's 209 of the second array 207 have a, preferably, F type connector 223 on a peripheral edge 225 opposite the edge 213. As best seen in FIG. 15, the PCB's 205 have first interface leads 227 in the form of microstrip lines extending alongside the slots 215. The PCB's 209 also have interface leads formed by microstrip lines 229 adjacent the slots 217. When the two arrays of PCB's are interlocked, as shown in FIG. 14, each of the microstrip lines 227 on the PCB's 205 comes in contact with a microstrip line 229 on a different one of the PCB's 209 and are soldered together at 231. It should be noted from Figure 15 that the ground plane 233 on the boards 205 is also soldered to the ground plane (not shown) on the underside of the PCB's 209. In the same manner, the ground plane 235 on the top surface of the PCB's 209 is soldered to the ground plane (not shown) on the opposite side of the boards 205.

Each of the PCB's 205 have a pattern of electrical branching elements 237 laid out as discussed above in a tree pattern and connected by a candelabra pattern of leads (microstrip lines) 239 connecting the connectors 219 with the interface leads 227.

The PCB's 209 also have a pattern of electrical branching elements 241 laid out in a tree configuration and connected by a candelabra pattern of leads (microstrip lines) 243 and connecting the connectors 223 to the interface leads 229. In the particular arrangement shown in FIG. 14, the branching elements 237 on the boards 205 are all splitters so that the signals applied to each of the PCB's 205 through the connectors 219 are equally provided to each of the PCB's 209. The branching elements 241 on the PCB's 209 are all two-way switches so that any of the signals applied to any of the connectors 219 may be switched to any of the connectors 223. The matrix 201 is a non-blocking matrix in that any one of the input signals applied to the connectors 219 can be switched to any one or more, including all, of the connectors 223. The entire eggcrate structure 224 can be mounted in a single housing indicated at 226 having appropriately placed openings (not shown) for the various connectors 219, 223.

Figure 16:
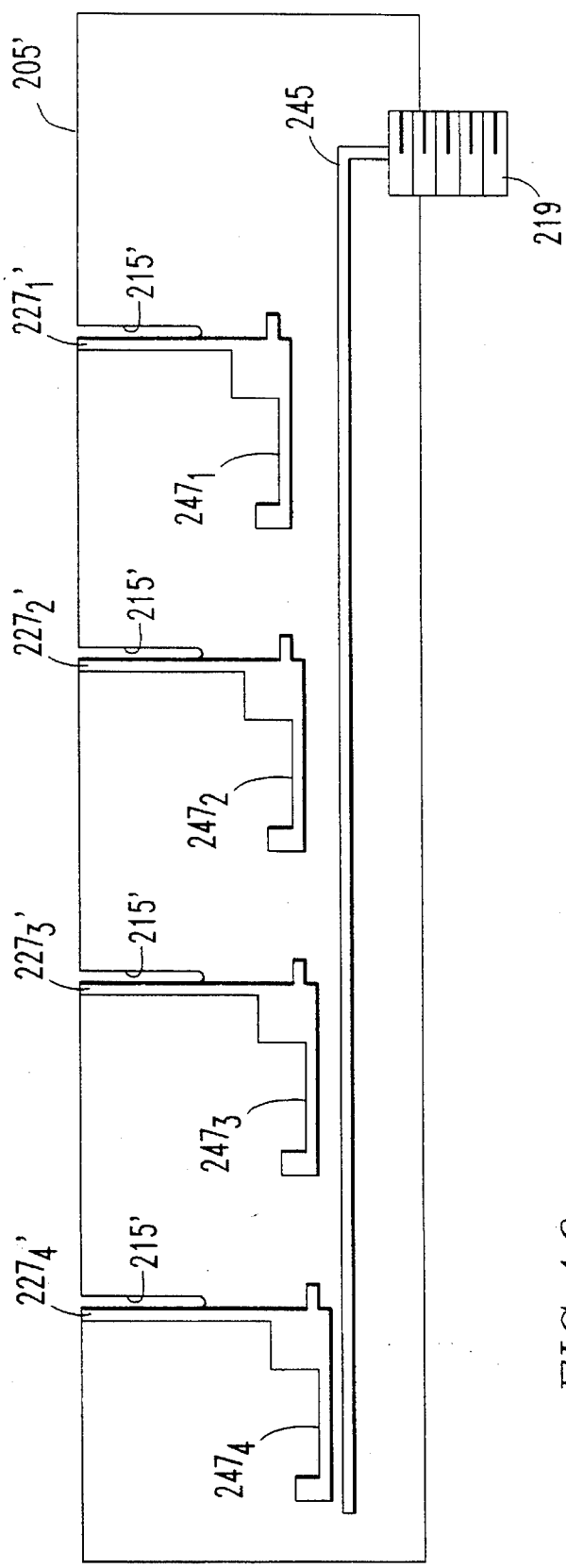
FIG. 16 is a plan view of another embodiment of a modular circuit board which can be used in the switching matrix of FIG. 14.

In place of the splitters used as the branching elements 237 on the PCB's 205 of FIG. 14, line couplers can be used. Referring to FIG. 16, PCB 205' has its connector 219 connected to a microstrip line 245 which extends longitudinally along the PCB. A microstrip line section $247_1$ extends parallel to but is spaced from the microstrip line 245. The signal applied to the microstrip line 245 is inductively coupled to the microstrip line section 247. The line segment 247 is connected to the interface lead 227' which, as explained above, extends alongside slot 215' for connection to the circuit of another PCB in the switching matrix. Similar line segments $247_2$, $247_3$ and $247_4$ are also arranged in spaced relation to the microstrip line 245 and each are connected to an interface lead $227'_2$ to $227'_4$. The spacing between the segments 247 and the microstrip line 245 determine the coupling and therefore the power drawn from the microstrip line 245 by each of the taps. As in known, this lateral spacing can vary between the microstrip lines $247_1$ and $247_4$ so that an equal amount of the power is drawn off by each and coupled to the respective load 227. The difference in spacing is exaggerated in FIG. 16 for clarity. Strip line couplers such as tiffs are described in U.S. Pat. No. 4,935,709 which is hereby incorporated by reference. While the path length to the coupler $247_4$ is somewhat longer than that to the other couplers, this difference in total path length is not significant for most applications. Generally, for n>8, couplers are preferred, as they provide more exact splitting of power with less circuit components and minimum labor. These couplers can also be used in reverse to combine signals.

It should be evident at this point that the bidirectional broadband switching system of the invention is very flexible, and while fairly simple assemblies have been illustrated for clarity, much larger switching assemblies can be realized utilizing the principles of the invention much more compactly, and at considerably less cost than is presently possible.

While specific embodiments of the invention have been described in detail, it will be appreciated by those skilled in the an that various modifications and alternatives to those details could be developed in light of the overall teachings of the disclosure. Accordingly, the particular arrangements disclosed are meant to be illustrative only and not limiting as to the scope of invention which is to be given the fill breadth of the claims appended and any and all equivalents thereof.

What is claimed is:

1. A modular bidirectional switch system comprising:
   an assembly of switch modules each of said switch modules comprising:
   a housing having an elongated front face and an opposite elongated rear face, a single first electrical connector mounted in said elongated rear face, a plurality of second electrical connectors mounted in spaced relation along said elongated front face and circuit means within said housing for selectively electrically connecting said single first electrical connector with at least any one of said plurality of second electrical connectors, said assembly further comprising a plurality of said switch modules stacked side by side with said first electrical connectors aligned to form a stack of switch modules, and an additional switch module having a different second electrical connector connected to the first electrical connector of each of the switch modules in said stack of switch modules.

2. The modular switch system of claim 1 wherein said plurality of second connectors on each switch module is equal to n and wherein said plurality of switch modules stacked side by side is between 2 and n and n is equal to at least 2.

3. The modular switch system of claim 2 wherein said first and second connectors are substantially identical coaxial connectors and wherein said assembly includes coaxial coupling members coupling said second connectors of said additional switch module to said first electrical connector of each of said plurality of switch modules.

4. The modular switch system of claim 1 wherein said housing of each switch module has a thickness t and said second electrical connectors are equally spaced apart along said elongated front face by a distance equal to x, wherein x is at least as large as t, such that the first electrical connectors of said switch modules in said stack of switch modules when spaced apart by said distance x are aligned with the second electrical connectors of said additional switch module.

5. The modular switch system of claim 4 wherein said plurality of switch modules stacked side by side and connected by said additional connecting switch module form a first subassembly and wherein said assembly of switch modules further includes a second subassembly comprising a number of said switch modules stacked side by side with said first electrical connectors of said number of switch modules aligned and another switch module having a different second electrical connector connected to the first electrical connector of each of said number of switch modules, and wherein the first electrical connector of said additional switch module of said first subassembly is connected to the first electrical connector of said another switch module of said second subassembly to form a switch assembly in which any second electrical connector in said plurality of switch modules in said first subassembly can be electrically connected to any second electrical connector in said number of switch modules in said second subassembly.

6. The modular switch system of claim 5 wherein said plurality of second electrical connectors in each switch module is equal to a maximum of n, and wherein the plurality of switch modules in the first subassembly is equal to r and the number of switch modules in said second subassembly is equal to s, and wherein r and s are each no greater than n.

7. The modular switch system of claim 6 wherein r and s are equal to n.

8. The modular switch system of claim 4 wherein said circuit means comprises electrically controlled switch means for selectively electrically connecting said single first electrical connector with any one of said plurality of second electrical connectors, control leads connected to said electrically controlled switch means, control lead connectors on each switch module to which said control leads are connected, said control lead connectors on said plurality of switch modules being aligned on a common face on each module, and control lead bus means having spaced apart bus connectors aligned with and mating with said control lead connectors.

9. The modular switch system of claim 8 wherein said control lead connectors are mounted on said rear faces of said plurality of switch modules forming said stack of switch modules.

10. A bidirectional broadband switch module comprising:
    a housing having an elongated front face and an opposite, elongated rear face;
    a single first electrical connector mounted in said elongated rear face of said housing;
    a plurality of second electrical connectors mounted in spaced relation along said elongated front face of said housing; and
    circuit means for selectively connecting said single first electrical connector to any one of said plurality of second electrical connectors, said circuit means comprising electrical switches and electrical leads connecting said electrical connectors and said electrical switches, and arranged to form electrical paths between said first electrical connector and each second electrical connector wherein each path has an equal number of said electrical switches and a substantially equal total length of electrical leads.

11. The switch module of claim 10 wherein said circuit means further comprises a circuit board and said electrical switches are mounted on said circuit board in a tree configuration with each of said second electrical connectors connected to an electrical switch at a common level of said tree configuration.

12. The switch module of claim 11 wherein said electrical leads comprise strip lines on said circuit board.

13. The switch module of claim 12 wherein said first electrical connector is substantially centered along said elongated rear face of said housing, wherein said tree configuration of said electrical switches is symmetrical about a central axis, and wherein said strip lines fan out from said first connector to said symmetrical tree configuration of electrical switches in a symmetrical candelabra pattern.

14. The switch module of claim 13 wherein said first electrical connector and said second electrical connectors are coaxial connectors.

15. The switch module of claim 13 wherein said circuit means includes selection means mounted in said housing for manually setting said electrical switches to selectively connect said first electrical connector to a selected one of said second electrical connectors.

16. A bidirectional, broadband, programmable switch module comprising:

support means comprising a planar substrate having a peripheral edge;

a single first coaxial connector affixed to said peripheral edge and projecting generally laterally outward therefrom;

a plurality of second coaxial connectors affixed in equal spaced relation along said peripheral edge and projecting generally laterally outward therefrom; and circuit means for selectively connecting said single first coaxial connector to any of at least one of said second coaxial connectors and comprising, a plurality of bidirectional electrical branching elements mounted on said planar substrate in a tree configuration with one of said bidirectional electrical branching elements forming a base of the tree configuration and through which a central axis of said tree configuration passes, and others of said bidirectional electrical branching elements forming a top of said tree configuration, and electrical leads on said planar substrate connecting said first coaxial connecter to said one bidirectional electrical branching element, connecting said second coaxial connectors to said others of said bidirectional electrical branching elements and connecting said bidirectional electrical branching elements in a candelabra pattern symmetrical about said central axis to form selectable paths between said first coaxial connector and each of said second coaxial connectors, with all of said paths having the same number of said bidirectional electrical branching elements and an approximately equal total length of said electrical leads.

17. The bidirectional, broadband programmable switch module of claim 16 wherein said first coaxial connecter and said second coaxial connectors are F type connectors.

18. The bidirectional, broadband, programmable switch module of claim 16 wherein said planar substrate in generally rectangular having first and second opposite elongated sides of said peripheral edge with said first coaxial connector affixed to said first side of said peripheral edge and said second coaxial connectors affixed in spaced relation along said second side of said peripheral edge.

19. The bidirectional, broadband, programmable switch module of claim 16 wherein said plurality of bidirectional electrical branching elements comprise devices selected from a group consisting of two-position switches, splitters, combiners, and line couplers all symmetrically arranged in said tree configuration.

20. The bidirectional, broadband, programmable switch module of claim 16 wherein said plurality of bidirectional electrical branching elements comprise at least one two-position electrically controlled switch in each of said selectable paths, and wherein said two-position electrically controlled switches default to a predetermined one of two positions to establish a predetermined default path connecting said single first coaxial connector to a predetermined one of said second coaxial connectors.

21. A modular, broadband, programmable switch system comprising:

an array of parallel spaced apart first planar circuit boards each having a first coaxial connector affixed thereto, first circuit means on each first planar circuit board comprising a plurality of first electrical branching elements and first electrical leads selectively connecting said first coaxial connector to any at least one of a plurality of first interface leads spaced apart along and extending substantially to a first edge of said first planar circuit boards, and an array of parallel spaced apart second planar circuit boards each having a second coaxial connecter affixed thereto, second circuit means on each second planar circuit board comprising a plurality of second electrical branching elements and second electrical leads selectively connecting said second coaxial connector to any at least one of a plurality of second interface leads spaced apart along and extending substantially to a first edge of said second planar circuit board, said array of parallel spaced apart second planar circuit boards being arranged generally transverse to said array of parallel spaced apart first planar circuit boards with said first edges of said first planar circuit boards confronting the first edges of said second planar circuit boards, and with a second interface lead on each second planar circuit board contacting and electrically joined to a first interface lead on a different first planar circuit board to form a plurality of selectable electrical paths between each first coaxial connecter and each second coaxial connector.

22. The modular, broadband, programmable switch system of claim 21 wherein said first edges of at least one of said array of first planar circuit boards and said array of second planar circuit boards is slotted adjacent said interface leads to receive and interlock with said first edges of the other of said array of first planar circuit boards and said array of second planar circuit boards.

23. The modular, broadband, programmable switch system of claim 21 wherein said first circuit means and second circuit means are arranged such that all of said paths between any first coaxial connector and any second coaxial connector are of substantially the same length and have the same number of first electrical branching elements, and the same number of second electrical branching elements.

24. The modular, broadband, programmable switch system of claim 23 wherein each of said first coaxial connectors is affixed to an edge of the first planar circuit board and projects laterally therefrom generally parallel to said first planar circuit board, and wherein each of said second coaxial connectors is affixed to an edge of the second planar circuit board and projects laterally therefrom generally parallel to the second planar circuit board.

* * * * *

UNITED STATES PATENT AND TRADEMARK OFFICE
CERTIFICATE OF CORRECTION

PATENT NO. : 5,481,073
DATED : January 2, 1996
INVENTOR(S) : SAMUEL SINGER et al.

It is certified that error appears in the above-indentified patent and that said Letters Patent is hereby corrected as shown below:

On the Cover Page, in the Abstract, line 14, "$n^{2xn2}$" should be --$n^2xn^2$--; and in the fourth line from the bottom, "firmed" should be --formed--.

Column 2, line 57, "$n^{2x1}$" should be --$n^2x1$--.

Column 3, line 13, "am" should be --are--.

Column 4, line 36, "pan of,the" should read --part of the--.

Column 5, line 37, --x-- should be inserted after "distance".

Column 6, line 49, "re,note" should be --remote--.

Column 7, line 8, "frown" should be --from--; and
line 67, "$77_1 14\ 77_7$" should be --$77_1$-$77_7$--.

Column 9, line 60, "trader" should be --under--; and
line 62, "nodal" should be --normal--.

Column 11, line 15, "tiffs" should be --this--;
line 35, "an" should be --art--; and
line 39, "fill" should be --full--.

UNITED STATES PATENT AND TRADEMARK OFFICE
CERTIFICATE OF CORRECTION

PATENT NO. : 5,481,073
DATED : January 2, 1996
INVENTOR(S) : SAMUEL SINGER et al.

It is certified that error appears in the above-indentified patent and that said Letters Patent is hereby corrected as shown below:

Claim 16, column 13, line 54, a comma --,-- should be inserted after "elements".

Signed and Sealed this

Tenth Day of June, 1997

Attest:

BRUCE LEHMAN

Attesting Officer

Commissioner of Patents and Trademarks